(12) United States Patent
Bikumandla

(10) Patent No.: US 8,680,454 B2
(45) Date of Patent: Mar. 25, 2014

(54) BACKSIDE-ILLUMINATED (BSI) PIXEL INCLUDING LIGHT GUIDE

(75) Inventor: Manoj Bikumandla, San Jose, CA (US)

(73) Assignee: OmniVision Technologies, Inc., Santa Clara, CA (US)

(\*) Notice: Subject to any disclaimer, the term of this patent is extended or adjusted under 35 U.S.C. 154(b) by 350 days.

(21) Appl. No.: 13/308,961

(22) Filed: Dec. 1, 2011

(65) Prior Publication Data
US 2013/0140432 A1    Jun. 6, 2013

(51) Int. Cl.
*H01L 27/00*     (2006.01)
*H01L 27/148*    (2006.01)

(52) U.S. Cl.
USPC ........................................ 250/208.1; 257/228

(58) Field of Classification Search
CPC .................................................. H01L 27/1464
USPC ......... 250/208.1; 257/228–230, 447, 460, 432
See application file for complete search history.

(56) References Cited

U.S. PATENT DOCUMENTS 8,368,157 B2 \* 2/2013 Lenchenkov ................. 257/432

\* cited by examiner

*Primary Examiner* — Thanh Luu
(74) *Attorney, Agent, or Firm* — Blakely Sokoloff Taylor & Zafman LLP

(57) ABSTRACT

Implementations of a pixel including a substrate having a front side, a back side, and a photosensitive region formed on or near the front side, a dielectric layer formed on the front side, and a metal stack having a bottom side and a top side, the bottom side being on the dielectric layer. A light guide is formed in the dielectric layer and the metal stack and extending from the front side of the substrate to the top side of the metal stack, the light guide having a refractive index equal to or greater than the refractive index of the substrate. Other implementations are disclosed and claimed.

25 Claims, 4 Drawing Sheets

BACKSIDE-ILLUMINATED (BSI) PIXEL INCLUDING LIGHT GUIDE

TECHNICAL FIELD

Disclosed embodiments relate generally to image sensors and in particular, but not exclusively, to backside-illuminated pixels including a light guide.

BACKGROUND

A typical image sensor includes a pixel array with multiple pixels, each having a photosensitive area, and supporting circuitry. Conductive lines that carry electrical signals among and between pixels are typically formed in dielectric layers over the front side of the pixel. In front-side illuminated (FSI) pixels, the conductive lines can reduce the amount of incident light reaching each pixel. Backside-illuminated (BSI) image sensors are image sensors where the light from the image to be captured is incident on the backside of the image sensor's pixel array instead of the front. One of the advantages of BSI image sensors is that the incident light can reach each pixel's photosensitive area without having to traverse the space between conductive lines on the front side of the pixel array.

One phenomenon that has been observed in BSI image sensors is that light reaching the pixels through the backside can be reflected by the interfaces between the various layers of substrate and dielectric that make up the image sensor, as well as being reflected by the conductive lines themselves. Among other things, this phenomenon can cause unnecessary and unwanted "ghosting" in images captured by the image sensor. The phenomenon can occur at any wavelength, but is more pronounced for longer wavelengths such as wavelengths in the red part of the spectrum.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method for backside-illuminated pixels including a front side light guide are described. Numerous specific details are described to provide a thorough understanding of embodiments of the invention, but one skilled in the relevant art will recognize that the invention can be practiced without one or more of the described details, or with other methods, components, materials, etc., that are not described. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
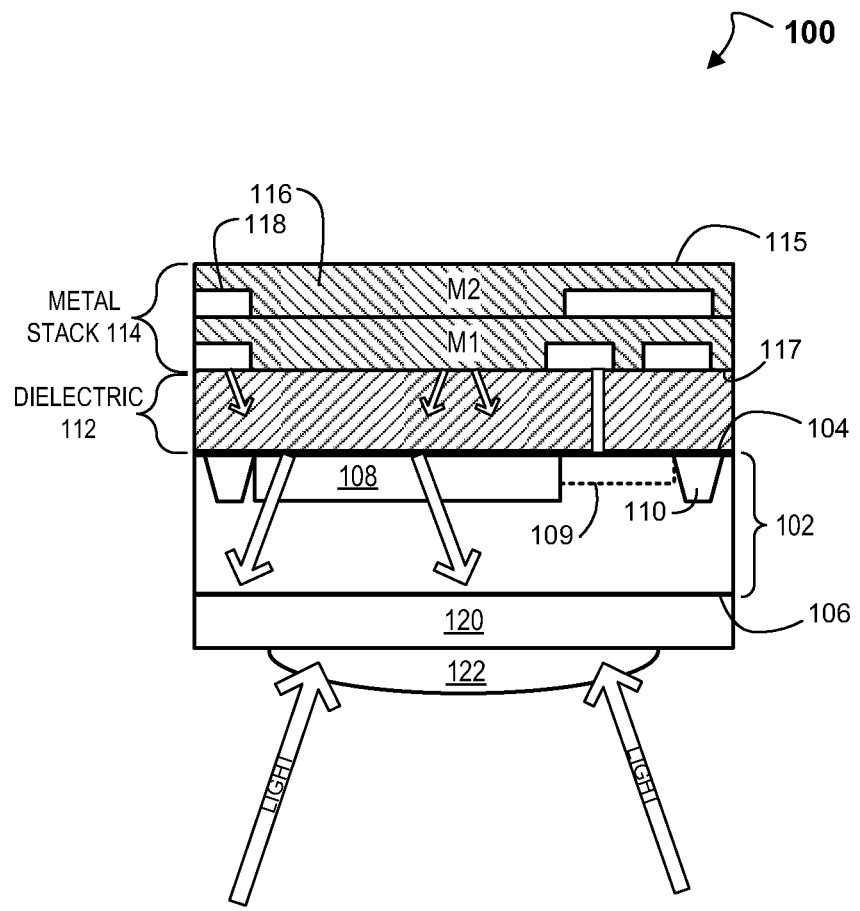
FIG. 1 is a cross-sectional drawing of an embodiment of a backside-illuminated (BSI) CMOS pixel.

FIG. 1 illustrates an embodiment of a backside-illuminated complementary metal oxide semiconductor (CMOS) pixel 100. Pixel 100 includes a substrate 102 having a front side 104 and a backside 106. A photosensitive region 108 is formed on or near front side 104; in one embodiment photosensitive region 108 can be on front side 104, but in other embodiments photosensitive region 108 can be below front side 104, for instance in embodiments in which a pinning layer is positioned between photosensitive region 108 and surface 104. Also formed on substrate 102 on or near front side 104 are a floating diffusion 109 adjacent to photosensitive region 108, and a pair of shallow trench isolation (STI) regions 110.

A dielectric layer 112 is formed on front side 104, and a metal stack 114 having a top side 115 and a bottom side 117 is formed on top of dielectric layer 112 such that bottom side 117 is on the dielectric layer. In the illustrated embodiment, metal stack 114 includes two metal layers M1 and M2, but in other embodiments metal stack 114 can include a greater or lesser number of layers. Metal stacks M1 and M2 are so called because they include metal interconnects that carry signals to and from pixels. Metal layer M2, for example, includes conductive traces 118 embedded in a dielectric material 116. Metal layer M1 is similar to metal layer M2, but in any given embodiment the individual metal layers in metal stack 114 need not have the same construction or be made of the same materials.

A color filter 120 is formed on back side 106 of substrate 102. In different embodiments color filter 120 can have different colors. For example in a pixel array using a red-green-blue (RGB) color filter array, color filter 120 for a given pixel 100 can be red, green or blue. A micro-lens 122 can be formed on color filter 120 to help focus incident light on to photosensitive region 108.

In operation of pixel 100, light is incident on the backside of the pixel. By illuminating the backside of pixel 100, the metal interconnect lines in metal stack 114 do not obscure the path between the object being imaged and the photosensitive region 108, resulting in greater signal generation by photosensitive region. Micro-lens 122 focuses the incident light on color filter 120 filters out of one, components of the incident light—red, for instance. Photons from the red light impinge on photosensitive region 108 and generate charge, but after the filtered incident light impinges on photosensitive region 108 it also impinges on the interface between substrate 102 and dielectric 112.

Typically the refractive index of dielectric 112 is lower than the refractive index of substrate 102. This mismatch of refractive indices at the substrate-dielectric interface results in some reflection at the interface so that light is reflected back from the interface as shown in the figure. Additional reflection can occur at other interfaces, such as the interface between dielectric 112 and metal stack 114, the interface between individual metal stacks M1 and M2, and the interface between conductive traces and the dielectric surrounding them. These reflections decrease the light collection efficiency of photosensitive region 108 and can be particularly troublesome at longer wavelengths, such as the wavelength of red light.

Figure 2:
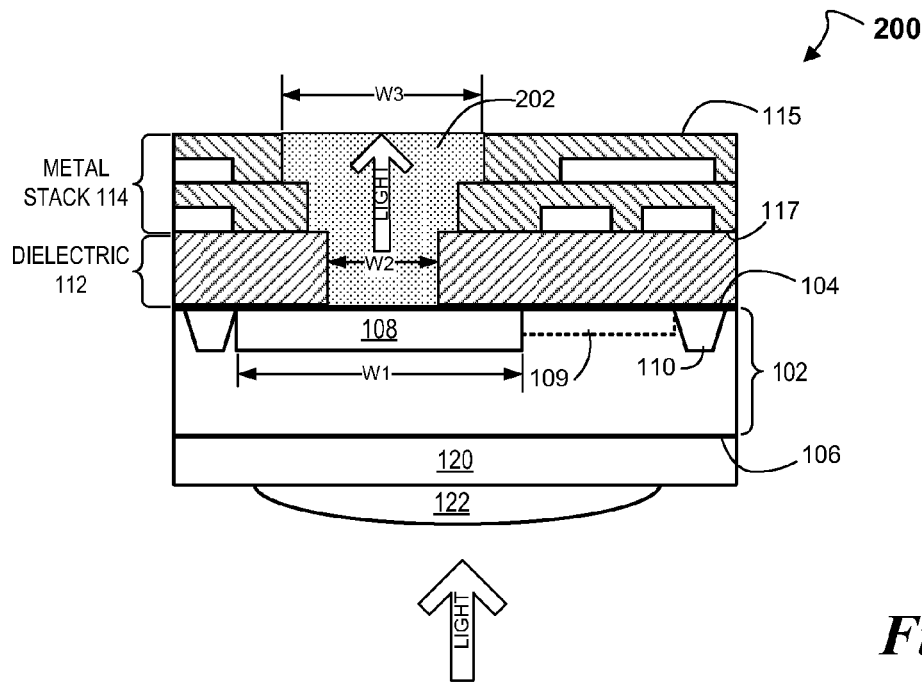
FIG. 2 is a cross-sectional drawing of an alternative embodiment of a backside-illuminated (BSI) CMOS pixel.

FIG. 2 illustrates a cross-section of an alternative embodiment of a backside-illuminated CMOS pixel 200. Pixel 200 has a construction that is in most respects similar the construction of pixel 100. The primary difference between the construction of pixel 200 and pixel 100 is that pixel 200 includes a light guide 202 formed on the front side of the pixel in dielectric layer 112 and metal stack 114. Light guide 202 extends from front side 104 of substrate 102 to top side 115 of metal stack 114, and has a width W2 at surface 104 and a width W3 at surface 115. In this embodiment light guide 202 has an inverse taper from front side 104 to top side 115—that is, W3 is greater than W2, such that the light guide is wider at top side 115 than at front side 104. In the illustrated embodiment the width W2 at front side 104 is less than the width W1 of photosensitive region 108, but in other embodiments W2 can be equal to or greater than W1.

Light guide 202 is formed of a material having a refractive index greater than or equal to the refractive index of substrate 102. By using a material with equal or higher refractive index, reflection at the interface between substrate 102 and dielectric layer 112 can be substantially reduced or eliminated. Reflection at other interfaces, such as the interface between dielectric 112 and metal stack 114, the interface between individual metal stacks M1 and M2, and the interface between conductive traces 118 and the dielectric surrounding them, can also be substantially reduced or eliminated using light guide 202.

Pixel 200 can be built using conventional techniques up until the formation of metal stack 114. After formation of the metal stack, an opening is patterned and etched into metal stack 114 and dielectric layer 112, down to top surface 104 of substrate 102. Once the opening is formed through dielectric 112 and metal stack 114, the opening can be filled with a suitable material having the required index of refraction to form light guide 202. Examples of materials that can be used for light guide 202 include materials that are substantially optically transparent in the desired range of wavelengths, such as optical grade acrylics, polycarbonates, glass, etc.

In operation of pixel 200, light is incident on the backside of the pixel, where is focused by micro-lens 122, filtered by color filter 120, and then travels through substrate 102 and impinges on photosensitive region 108. As a result of the light guide 202, at the interface between top surface 104 and dielectric 112 there is no longer a decrease in refractive index at the interface that causes reflection of the light back in the incident direction. Instead, because the refractive index mismatch is such that the refractive index of light guide 202 is equal to or greater than the refractive index of substrate 102, the light passes through the interface instead of being reflected and travels through light guide 202 as shown in the figure.

The presence of light guide 202 also prevents reflection from other interfaces between materials, such as the interface between dielectric 112 and metal stack 114, the interfaces between separate layers and the metal stack, or the interfaces between the electrical traces in the dielectric in the metal layers. Because the reflection at the interface between top surface 104 and dielectric 112 is most pronounced with higher wavelength radiation, such as red light, in one embodiment color filter 120 is red, but in other embodiments light guide 202 can be used together with color filters of other colors such as blue, green, magenta, cyan, yellow or panchromatic (white) pixels.

Figure 3:
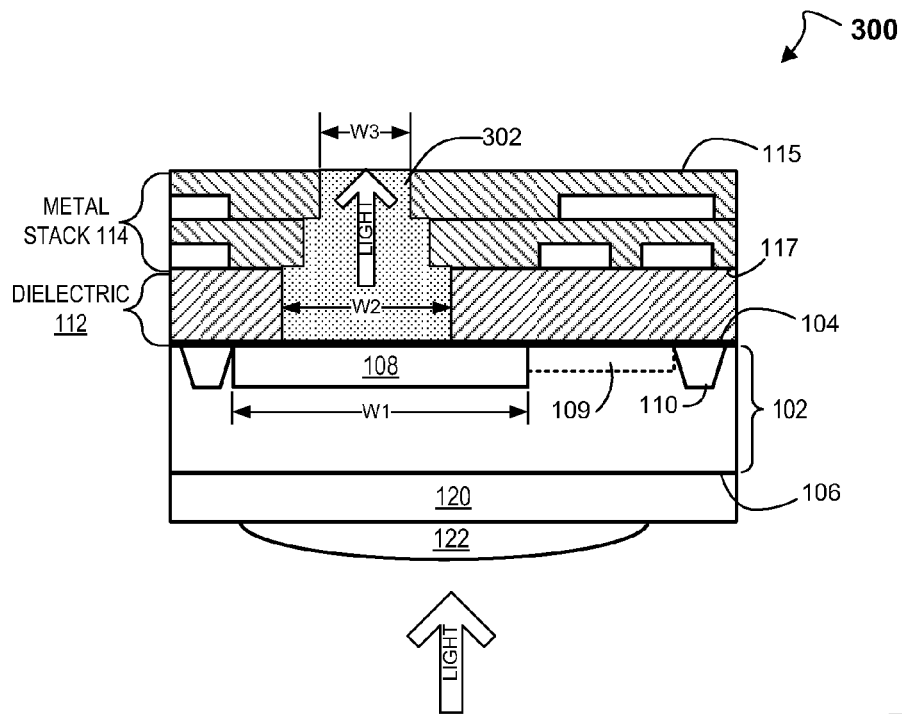
FIG. 3 is a cross-sectional drawing of another alternative embodiment of a backside-illuminated (BSI) CMOS pixel.

FIG. 3 illustrates another embodiment of a CMOS pixel 300. The construction of CMOS pixel 300 is in most respects similar to the construction of pixel 200. The primary difference between pixel 300 and pixel 200 is the inclusion pixel 300 of light guide 302. Light guide 302 is similar in construction to light guide 202, except that light guide 302 has a positive taper between front side 104 and top surface one 115. In other words, light guide 302 has dimension W2 at surface 104 and dimension W3 and surface 115, but in this embodiment W2 is greater than W3, resulting in a taper between surface 104 and surface 115. As with pixel 200, in the illustrated embodiment W2 is less than W1, the dimension of the photosensitive region 108, but in other embodiments W2 could be greater to or equal than W1. Light guide 302 is otherwise similar to light guide 202 in both construction and operation.

Figure 4:
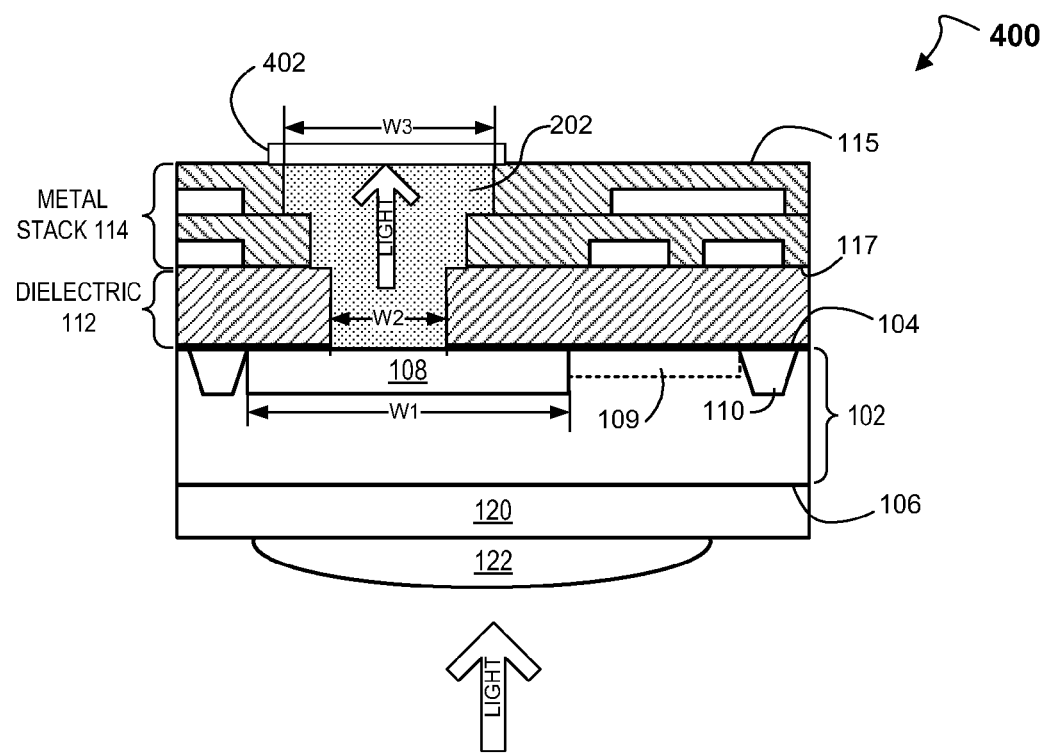
FIG. 4 is a cross-sectional drawing of yet another alternative embodiment of a backside-illuminated (BSI) CMOS pixel.

FIG. 4 illustrates an alternative embodiment of a CMOS pixel 400. Pixel 400 is in most respects similar to pixel 200. The primary difference between pixels 400 and 200 is the inclusion in pixel 400 of a high absorption filter 402 at the outlet of light guide 202. High absorption filter 402 is formed on top side 115 and has a width substantially equal to or greater than the width W3 of light guide 202 at surface 115. High absorption filter 402 can absorb radiation or light that travels through light guide 202 so that it doesn't exit the front side of the pixel 400. In one embodiment in which color filter 120 is red, high absorption filter 402 can be made of a material that is highly absorbent in the red part of the spectrum, but in other embodiments it can be made of other materials. In one embodiment high absorption filter 402 can be formed by depositing a layer of suitable material on surface 115, spreading the layer by techniques such as spin coating, and then patterning and etching the layer to restrict its width to substantially the width W3. In other embodiments, layer 402 can also be chemically-mechanically polished in a rough manner so that it results in a diffusing surface.

Figure 5:
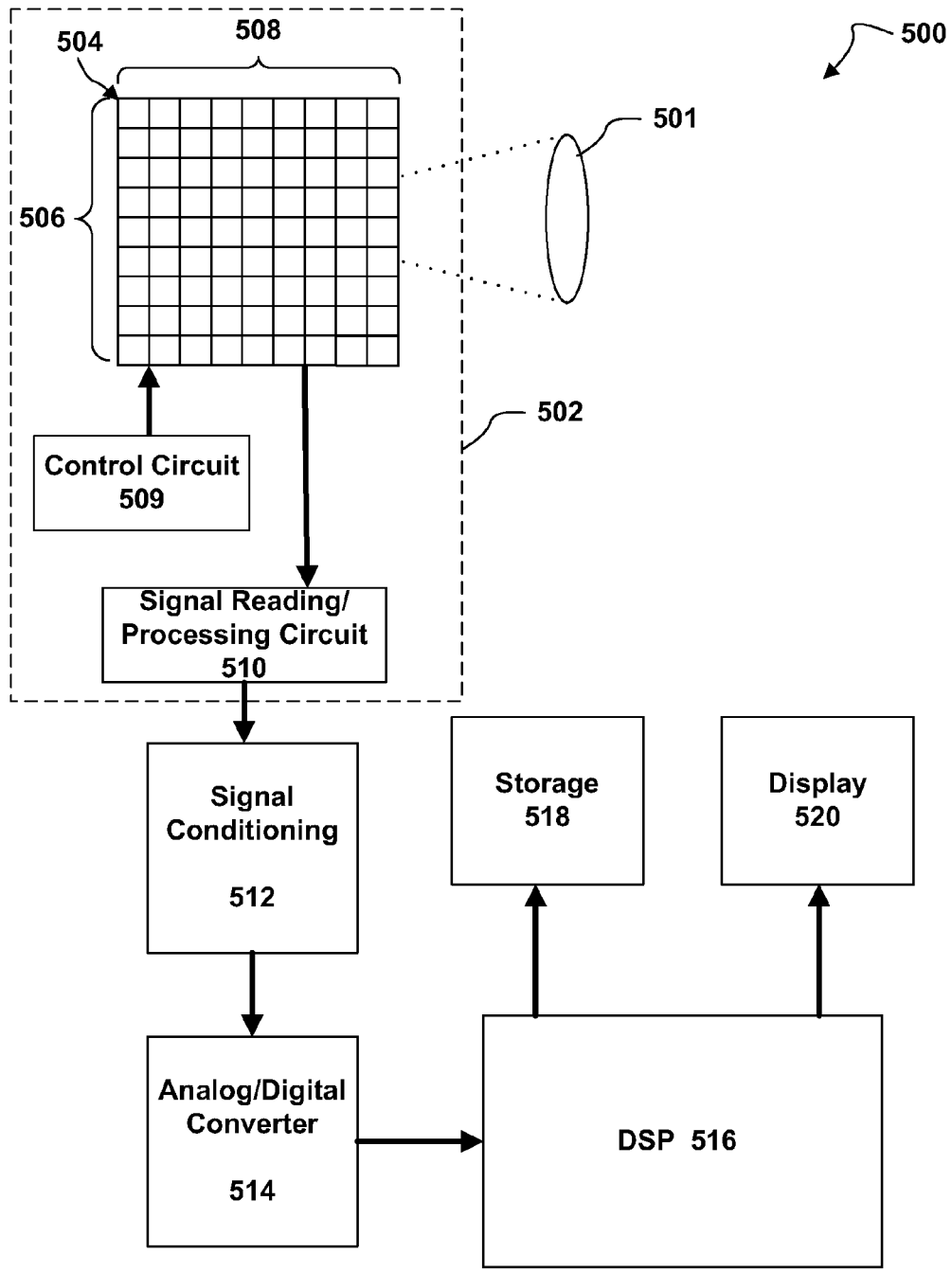
FIG. 5 is a block diagram of an embodiment of an imaging system.

FIG. 5 illustrates an embodiment of an imaging system 500. Optics 501, which can include refractive, diffractive or reflective optics or combinations of these, are coupled to image sensor 502 that includes a pixel array 504, a control circuit 509 and a signal reading and processing circuit 510. Optics 501 focus an image onto the pixels in pixel array 504. The pixel array then captures the image and the remainder of imaging system 500 processes the pixel data from the image.

Pixel array 504 is a two-dimensional ("2D") array of backside illuminated imaging sensors or pixels. In one embodiment, each pixel is a complementary metal-oxide-semiconductor ("CMOS") imaging pixel, and at least one pixel in the array can be one of the BSI pixel embodiments shown in FIGS. 2-4. When individual pixels are formed into a pixel array, supporting elements such as color filters and micro-lenses can also be formed into arrays. As illustrated, each pixel in the array is arranged rows 506 and columns 508 to acquire image data of a person, place, or object, which can then be used to render a 2D image of the person, place, or object. Illustrated pixel array 504 is regularly shaped, but in other embodiments the array can have a regular or irregular arrangement different than shown and can include more or less pixels, rows, and columns than shown. Moreover, in different embodiments pixel array 504 can be a color image sensor including red, green, and blue pixels or can be a magenta-cyan-yellow image sensor. In some embodiments of pixel array 504 using more than one pixel such as the ones illustrated in FIGS. 2-4, the dimensions W2 and W3 of the light guide can be varied across the pixel array to correct for color shading performance. Thus, the dimension and/or shape of a pixel's light guide may vary across the pixel array. For example, in one embodiment the dimensions and/or shape of the light guide can vary radially from the center to the edges of the array, but in another embodiment the dimension and/or shape of the light guide can vary from the center of the array to left and right edges. Other variations are possible in other embodiments.

During operation of pixel array 504 to capture an image, each pixel in pixel array 504 captures incident light (i.e., photons) during a certain exposure period and converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Control circuit 509 is coupled to pixel array 504 to control operational characteristic of one or more pixels within the pixel array. For example, control circuit 509 can generate a shutter signal for controlling image acquisition. In one embodiment, the shutter signal is a global shutter signal for enabling all pixels within pixel array 504 to simultaneously capture their respective image data during a single acquisition window. In an alternative embodiment, the shutter signal is a rolling shutter signal whereby each row, column, or group of pixels is sequentially read out during consecutive acquisition windows.

Image sensor 502 includes signal reading and processing circuit 510. Although shown in the drawing as elements separate from pixel array 504, in some embodiments control circuit 509 and/or signal reading and processing circuit 510 can be integrated with pixel array 504 on the same substrate or can comprise circuitry and logic embedded within the pixel array. In other embodiments, however, signal reading and processing circuit 510 can be an element external to pixel array 504 as shown in the drawing. In still other embodiments, reading and processing circuit 510 can be an element not only external to pixel array 504, but external to image sensor 502 as well.

Among other things, signal reading and processing circuit 510 can include circuitry and logic that methodically reads analog signals from each pixel, filters these signals, corrects for defective pixels, and so forth. In an embodiment where signal reading and processing circuit 510 performs only some reading and processing functions, the remainder of the functions can be performed by one or more other components such as signal conditioner 512 or DSP 516. In one embodiment, signal reading and processing circuit 510 can read out a column of image data at a time along readout column lines or can read out the image data using a variety of other techniques, such as a serial readout or a full parallel readout of all pixels simultaneously.

Signal conditioner 512 is coupled to image sensor 502 to receive and condition analog signals from pixel array 504 and reading and processing circuit 510. In different embodiments, signal conditioner 512 can include various components for conditioning analog signals. Examples of components that can be found in the signal conditioner include filters, amplifiers, offset circuits, automatic gain control, etc. In an embodiment where signal conditioner 512 includes only some of these elements and performs only some conditioning functions, the remaining functions can be performed by one or more other components such as circuit 510 or DSP 516. Analog-to-digital converter (ADC) 514 is coupled to signal conditioner 512 to receive conditioned analog signals corresponding to each pixel in pixel array 504 from signal conditioner 512 and convert these analog signals into digital values.

Digital signal processor (DSP) 516 is coupled to analog-to-digital converter 514 to receive digitized pixel data from ADC 514 and process the digital data to produce a final digital image. DSP 516 can include a processor and an internal memory in which it can store and retrieve data. Function logic within DSP 516 can simply store the image data or even manipulate the image data by applying post image effects (e.g., crop, rotate, remove red eye, adjust brightness, adjust contrast, or otherwise). After the image is processed by DSP 516, it can be output to one or both of a storage unit 518 such as a flash memory or an optical or magnetic storage unit and a display unit 520 such as an LCD screen.

The above description of illustrated embodiments of the invention, including what is described in the abstract that follows, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A pixel comprising:
   a substrate having a front side, a back side, and a photosensitive region formed on or near the front side;
   a dielectric layer formed on the front side;
   a metal stack having a bottom side and a top side, the bottom side being on the dielectric layer; and
   a light guide formed in the dielectric layer and the metal stack and extending from the front side of the substrate to the top side of the metal stack, the light guide having a refractive index equal to or greater than the refractive index of the substrate.

2. The pixel of claim 1 wherein the metal stack comprises one or more metal layers, each metal layer including conductive paths formed in a dielectric.

3. The pixel of claim 1, further comprising a high-absorption filter placed over the light guide on the top side of the metal stack.

4. The pixel of claim 1, further comprising a color filter formed over the back side of the pixel.

5. The pixel of claim 4 wherein the color filter is red.

6. The pixel of claim 4, further comprising a microlens formed over the color filter.

7. The pixel of claim 1 wherein the light guide comprises:
   a hole etched in the dielectric layer and the metal stack between the front surface of the substrate and the top surface of the metal stack; and
   a light guide material filling the hole.

8. The pixel of claim 1 wherein the light guide material comprises an optically transparent material.

9. A system comprising:
   a pixel array including therein one or more pixels comprising:
      a substrate having a front side, a back side, and a photosensitive region formed on or near the front side,
      a dielectric layer formed on the front side,
      a metal stack having a bottom side and a top side, the bottom side being on the dielectric layer, and
      a light guide formed in dielectric layer and the metal stack and extending from the front side of the substrate to the top side of the metal stack, the light guide having a refractive index equal to or greater than the refractive index of the substrate; and control circuitry and processing circuitry coupled to the pixel array to read out and process a signal from the one or more pixels in the pixel array.

10. The system of claim 9 wherein the pixels in the pixel array include light guides having varying dimensions and/or shapes.

11. The system of claim 9, further comprising a color filter array formed over the back side of the pixel array such that each pixel is optically coupled to a color filter.

12. The system of claim 11 wherein the color filter array includes red filters.

13. The system of claim 12 wherein the pixels in the pixel array that have light guides are the pixels optically coupled to red filters.

14. The system of claim 11, further comprising a microlens array formed over the color filter array.

15. The system of claim 9, further comprising high-absorption filter placed over each light guide on the top side of the metal stack.

16. The system of claim 9 wherein the light guide comprises:
    a hole etched in the metal stack between the front surface of the substrate and the top surface of the metal stack; and
    a light guide material filling the hole.

17. The system of claim 16 wherein the light guide material comprises an optically transparent material.

18. A process comprising:
    forming one or more pixels in a substrate having a front side and a back side, the one or more pixels formed on or near the front side;
    forming a dielectric layer on a front side;
    forming a metal stack over the dielectric layer, the metal stack having a top side and a bottom side, the bottom side being on the dielectric layer; and
    forming a light guide in the metal stack, the light guide extending from the front side of the substrate to the top side of the metal stack and the light guide having a refractive index equal to or greater than the refractive index of the substrate.

19. The process of claim 18 wherein the metal stack comprises one or more metal layers, each metal layer including conductive paths formed in a dielectric.

20. The process of claim 18, further comprising forming a high-absorption filter over the light guide on the top side of the metal stack.

21. The process of claim 18, further comprising a color filter formed over the backside of the pixel.

22. The process of claim 21 wherein the color filter is red.

23. The process of claim 21, further comprising forming a microlens over the color filter.

24. The process of claim 18 wherein forming the light guide comprises:
    etching a hole in the dielectric layer and the metal stack between the front side of the substrate and the top side of the metal stack; and
    filling the hole with a light guide material.

25. The process of claim 24 wherein the light guide material comprises an optically transparent material.

* * * * *